(12) United States Patent
Wilson

(10) Patent No.: US 7,983,042 B2
(45) Date of Patent: Jul. 19, 2011

(54) THERMAL MANAGEMENT SYSTEM AND METHOD FOR THIN MEMBRANE TYPE ANTENNAS

(75) Inventor: James S. Wilson, Hurst, TX (US)

(73) Assignee: Raytheon Company, Waltham, MA (US)

( * ) Notice: Subject to any disclaimer, the term of this patent is extended or adjusted under 35 U.S.C. 154(b) by 1446 days.

(21) Appl. No.: 10/869,183

(22) Filed: Jun. 15, 2004

(65) Prior Publication Data

US 2005/0275589 A1 Dec. 15, 2005

(51) Int. Cl.
*H05K 5/00* (2006.01)
*H05K 7/00* (2006.01)
*H01B 17/00* (2006.01)
*F28F 7/00* (2006.01)
*F28D 15/00* (2006.01)
*H01Q 1/48* (2006.01)

(52) U.S. Cl. ........ 361/700; 361/699; 361/715; 361/728; 361/679.53; 361/679.52; 165/80.4; 165/104.33; 165/104.26; 165/104.22; 174/15.1; 343/846

(58) Field of Classification Search .................. 361/700, 361/699, 715, 728, 679.53, 679.52; 165/80.4, 165/104.33, 104.26, 104.22; 174/15.1; 343/846
See application file for complete search history.

(56) References Cited

U.S. PATENT DOCUMENTS

| | | | | |
|---|---|---|---|---|
| 3,651,865 A | * | 3/1972 | Feldmanis | 165/80.4 |
| 3,749,159 A | * | 7/1973 | Meijer | 165/104.26 |
| 3,834,457 A | * | 9/1974 | Madsen | 165/104.26 |
| 3,971,435 A | * | 7/1976 | Peck | 165/78 |
| 4,118,756 A | * | 10/1978 | Nelson et al. | 361/700 |
| 4,612,978 A | * | 9/1986 | Cutchaw | 165/104.33 |
| 4,718,163 A | * | 1/1988 | Berland et al. | 29/837 |
| 4,765,400 A | * | 8/1988 | Chu et al. | 165/185 |
| 4,777,561 A | * | 10/1988 | Murphy et al. | 361/700 |
| 4,880,052 A | * | 11/1989 | Meyer et al. | 165/104.14 |
| 4,931,905 A | * | 6/1990 | Cirrito et al. | 361/700 |
| 4,964,458 A | * | 10/1990 | Flint et al. | 165/80.4 |
| 5,050,037 A | * | 9/1991 | Yamamoto et al. | 361/699 |
| 5,069,274 A | * | 12/1991 | Haslett et al. | 165/272 |
| 5,219,020 A | * | 6/1993 | Akachi | 165/104.26 |
| 5,253,702 A | * | 10/1993 | Davidson et al. | 165/80.4 |
| 5,268,812 A | * | 12/1993 | Conte | 361/698 |
| 5,283,715 A | * | 2/1994 | Carlsten et al. | 361/702 |
| 5,300,810 A | | 4/1994 | Eden | |
| 5,404,272 A | * | 4/1995 | Lebailly et al. | 361/700 |
| 5,608,610 A | * | 3/1997 | Brzezinski | 361/704 |
| 5,704,416 A | * | 1/1998 | Larson et al. | 165/104.33 |
| 5,720,338 A | * | 2/1998 | Larson et al. | 165/46 |
| 5,769,154 A | * | 6/1998 | Adkins et al. | 165/104.26 |
| 5,783,862 A | * | 7/1998 | Deeney | 257/714 |
| 5,992,168 A | * | 11/1999 | Pfister et al. | 62/259.2 |

(Continued)

OTHER PUBLICATIONS

European Search Report, 2 pages, Oct. 28, 2005.

*Primary Examiner* — Jayprakash N Gandhi
*Assistant Examiner* — Bradley H Thomas
(74) *Attorney, Agent, or Firm* — Baker Botts L.L.P.

(57) ABSTRACT

According to an embodiment of the present invention, a thermal management system for electronic components includes a plurality of spacers disposed between a first flexible substrate and a second flexible substrate to form a plurality of heat transfer regions each having a plurality of capillary pumping regions, a two-phase fluid disposed between at least one pair of adjacent spacers, and a plurality of electronic components coupled to a mounting surface of the first flexible substrate.

8 Claims, 3 Drawing Sheets

U.S. PATENT DOCUMENTS

| | | | |
|---|---|---|---|
| 6,008,987 A * | 12/1999 | Gale et al. | 361/700 |
| 6,082,443 A * | 7/2000 | Yamamoto et al. | 165/104.26 |
| 6,102,110 A * | 8/2000 | Julien et al. | 165/104.33 |
| 6,148,906 A * | 11/2000 | Li et al. | 165/104.33 |
| 6,191,946 B1 * | 2/2001 | Yu et al. | 361/704 |
| 6,230,790 B1 * | 5/2001 | Hemingway et al. | 165/80.4 |
| 6,256,201 B1 * | 7/2001 | Ikeda et al. | 361/704 |
| 6,421,013 B1 * | 7/2002 | Chung | 343/700 MS |
| 6,474,074 B2 * | 11/2002 | Ghoshal | 62/3.7 |
| 6,578,626 B1 * | 6/2003 | Calaman et al. | 165/80.4 |
| 6,617,671 B1 * | 9/2003 | Akram | 257/668 |
| 6,650,544 B1 * | 11/2003 | Lai | 361/700 |
| 6,666,260 B2 * | 12/2003 | Tantoush | 165/80.3 |
| 6,843,308 B1 * | 1/2005 | Duval | 165/104.26 |
| 6,880,626 B2 * | 4/2005 | Lindemuth et al. | 165/104.26 |
| 6,945,317 B2 * | 9/2005 | Garner et al. | 165/104.26 |
| 6,957,692 B1 * | 10/2005 | Win-Haw et al. | 165/104.33 |
| 6,983,790 B2 * | 1/2006 | Ippoushi et al. | 165/104.22 |
| 6,988,315 B2 * | 1/2006 | Parish et al. | 29/890.045 |
| 6,989,991 B2 * | 1/2006 | Barson et al. | 361/699 |
| 6,997,245 B2 * | 2/2006 | Lindemuth et al. | 165/104.26 |
| 7,013,958 B2 * | 3/2006 | Garner et al. | 165/104.26 |
| 7,017,651 B1 * | 3/2006 | Wilson et al. | 165/47 |
| 7,180,751 B1 * | 2/2007 | Geschke et al. | 361/788 |
| 7,292,439 B2 * | 11/2007 | Wilson et al. | 361/700 |
| 7,518,868 B2 * | 4/2009 | Farrow et al. | 361/700 |
| 7,540,319 B2 * | 6/2009 | Mochizuki et al. | 165/104.26 |
| 7,621,316 B2 * | 11/2009 | Kawabata et al. | 165/80.3 |
| 2002/0029873 A1 * | 3/2002 | Sugito et al. | 165/166 |
| 2002/0100968 A1 | 8/2002 | Zuo et al. | |
| 2003/0210527 A1 * | 11/2003 | Saita et al. | 361/700 |
| 2004/0211549 A1 * | 10/2004 | Garner et al. | 165/104.26 |
| 2006/0061974 A1 * | 3/2006 | Soga et al. | 361/743 |
| 2006/0146496 A1 * | 7/2006 | Asfia et al. | 361/700 |

* cited by examiner

US 7,983,042 B2

THERMAL MANAGEMENT SYSTEM AND METHOD FOR THIN MEMBRANE TYPE ANTENNAS

TECHNICAL FIELD OF THE INVENTION

This invention relates in general to thermal management of electronic equipment and, more particularly, to a thermal management system and method for thin membrane type antennas.

BACKGROUND OF THE INVENTION

A trend for electronic equipment is lighter weight and lower cost. Lighter weight electronic equipment is especially important for aerospace applications, such as Active Electronically Scanned Arrays ("AESAs") or other types of antennas. Antennas, especially thin membrane type antennas, often have significant power dissipation due to the type of electronic components involved. It is important to control the thermal gradients and temperature of these systems to not only ensure adequate operation but to increase capabilities of antenna systems. For example, space-based antennas often use metal plates having high thermal conductivity to spread the heat because these antennas are ultimately cooled by radiation. But these metal plates increase the mass of the antenna systems.

SUMMARY OF THE INVENTION

According to an embodiment of the present invention, a thermal management system for electronic components includes a plurality of spacers disposed between a first flexible substrate and a second flexible substrate to form a plurality of heat transfer regions each having a plurality of capillary pumping regions, a two-phase fluid disposed between at least one pair of adjacent spacers, and a plurality of electronic components coupled to a mounting surface of the first flexible substrate.

Embodiments of the invention provide a number of technical advantages. Embodiments of the invention may include all, some, or none of these advantages. For example, in one embodiment, two-phase heat transfer is integrated directly into an antenna membrane to facilitate a low-cost thermal management system for the antenna that enhances thermal performance and reduces weight of space-based antenna systems. Liquid to vapor phase change has the ability to transfer thermal energy with a very small temperature penalty. Such a thermal management system is particularly well suited for space applications because large gravity loads are not present to degrade the performance and because of the absence of atmospheric pressure. Much larger active antenna arrays may be enabled by this method.

Other technical advantages are readily apparent to one skilled in the art from the following figures, descriptions, and claims.

DETAILED DESCRIPTION OF THE INVENTION

Embodiments of the present invention and some of their advantages are best understood by referring to FIGS. 1A through 4 of the drawings, like numerals being used for like and corresponding parts of the various drawings.

Figure 1A:
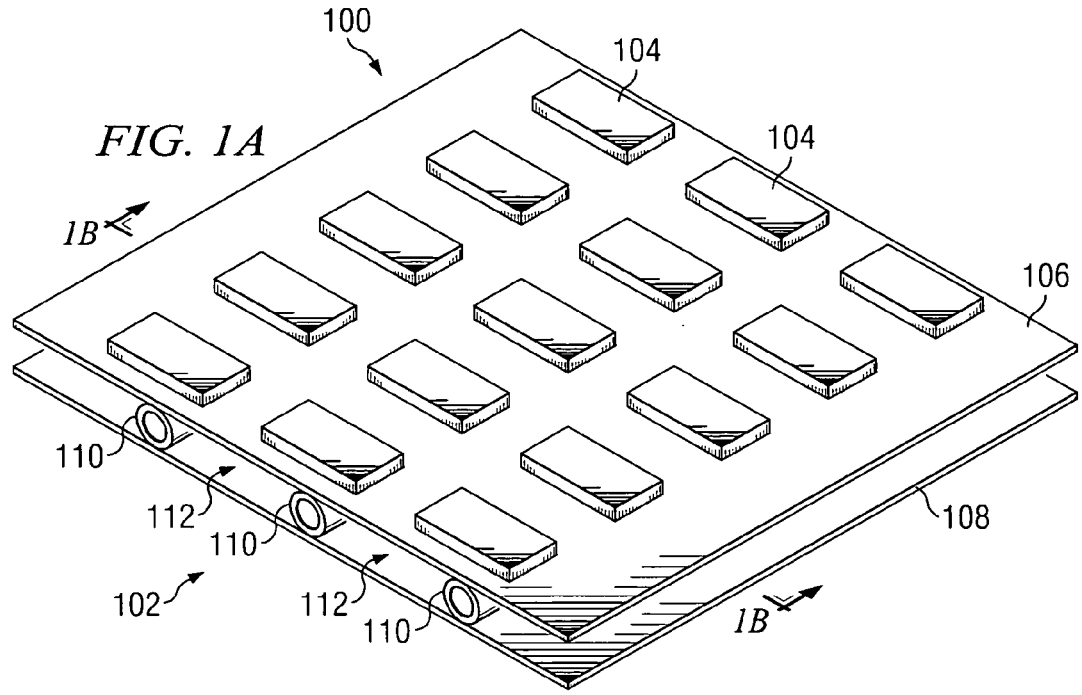
FIG. 1A is a perspective view of a portion of a thin membrane antenna having a thermal management system in accordance with an embodiment of the invention.
Figure 1B:
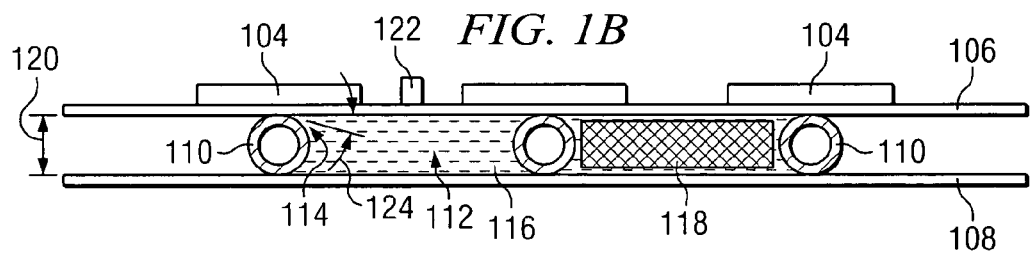
FIG. 1B is a cross-section of the thin membrane antenna of FIG. 1.

FIG. 1A is a perspective view, and FIG. 1B is a cross-section, of a portion of a thin membrane antenna 100 incorporating a thermal management system 102 in accordance with one embodiment of the present invention. In the illustrated embodiment, antenna 100 includes a plurality of electronic components 104 mounted on a first flexible substrate 106 and functions as a space-based antenna; however, the present invention contemplates other suitable electronic systems associated with thermal management system 102. Generally, thermal management system 102 functions to control the thermal gradients caused by electronic components 104 during operation in order to ensure proper functioning of antenna 100.

In the illustrated embodiment, thermal management system 102 includes a plurality of spacers 110 disposed between first flexible substrate 106 and a second flexible substrate 108. This forms a plurality of heat transfer regions 112 having a plurality of capillary pumping regions 114.

In the illustrated embodiment, first flexible substrate 106 is a flexible circuit board that includes suitable routing therein for electronic components 104 so that it may function as an antenna. However, electronic components 104 may also be associated with second flexible substrate 108 in other embodiments. Both first flexible substrate 106 and second flexible substrate 108 may be formed from any suitable material; however, in one embodiment, first flexible substrate 106 and second flexible substrate 108 are both formed from a relatively lightweight material, such as Mylar®, Kapton®, or a suitable metallized polymer.

Although first flexible substrate 106 and second flexible substrate 108 may have any suitable shape and any suitable thickness, in one embodiment, a thickness of first flexible substrate 106 and second flexible substrate 108 is 0.005 inches. Thermal management system 102 is particularly suitable for space-based applications because it is not exposed to the atmospheric pressure existing in the Earth's atmosphere. First flexible substrate 106 and second flexible substrate 108 may be separated by any suitable distance 120 (FIG. 1B); however, in one embodiment, distance 120 is no more than 0.1 inch.

Spacers 110 may be any suitable elements that function to create heat transfer regions 112 and capillary pumping regions 114. In one embodiment, spacers 110 are tubes having any suitable cross-section, such as circular, or may be solid wires having any suitable cross-section. In one embodiment, spacers 110 are positioned directly under respective electronic components 104; however, spacers 110 may be arranged in any suitable configuration.

Heat transfer regions 112 are filled with a suitable two-phase fluid 116 as illustrated best in FIG. 1B. Two-phase fluid 116 may be any suitable two-phase fluid, such as methanol or other fluid suitable for the operating conditions for antenna 100. For example, in space-based applications, a suitable fluid would be one that would not freeze in space and that boils at the right temperature and pressure. A valve 122 may be coupled to either first flexible substrate 106 or second flexible substrate 108 in order to obtain a desired amount and pressure of the two-phase fluid 116 within heat transfer regions 112. In one embodiment, two-phase fluid 116 is at a pressure of no more than two psia and is at least ten percent vapor by mass.

As described above, spacers 110 disposed between first flexible substrate 106 and second flexible substrate 108 form a plurality of capillary pumping regions 114. In one embodiment, capillary pumping regions 114 resemble crotches or sharp corners for increased capillary force. This produces an acute angle 124. Depending on the configuration of spacers 110, acute angle 124 may be any suitable acute angle.

Capillary pumping regions 114 draw liquid from the two-phase fluid 116 and the heat generated by electronic components 104 vaporizes the liquid drawn therein. The vapor then moves away from capillary pumping regions 114 and condenses in the larger area between adjacent spacers 110. This recycling of two-phase fluid 116 then continues during operation of antenna 100 to facilitate efficient heat transfer from electronic components 104 into two-phase fluid 116 to control the thermal gradients within antenna 100. In one embodiment, in order to draw the fluid from the condensing areas and from areas in between electronic components 104 to capillary pumping regions 114, a wicking material 118, such as a wire mesh or other suitable wicking material, may be utilized.

In operation of one embodiment of the invention, spacers 110 are disposed between first flexible substrate 106 and second flexible substrate 108. Electronic components 104 are coupled to either first flexible substrate 106 or second flexible substrate 108 such that they are positioned over respective spacers 110. Heat transfer regions 112 are filled with two-phase fluid 116 with or without wicking material 118. A completed antenna 100 is launched into space and valve 122 is utilized to evacuate heat transfer regions 112 in space in order to get the pressure of two-phase fluid 116 down to about one to two psia. Antenna 100 then begins its operation and electronic components 104 start emitting or radiating heat throughout first flexible substrate 106. The heat generated by electronic components 104 then draws the small amount of liquid in two-phase fluid 116 into capillary pumping regions 114 where a phase change takes place and evaporates the liquid of two-phase fluid 116. This gas then condenses within the larger area between spacers 110 before being pumped into capillary pumping regions 114 again. This two-phase heat transfer cycle then keeps repeating itself during the operation of antenna 100 in order to efficiently transfer heat from electronic components 104 to two-phase fluid 116.

Figure 2:
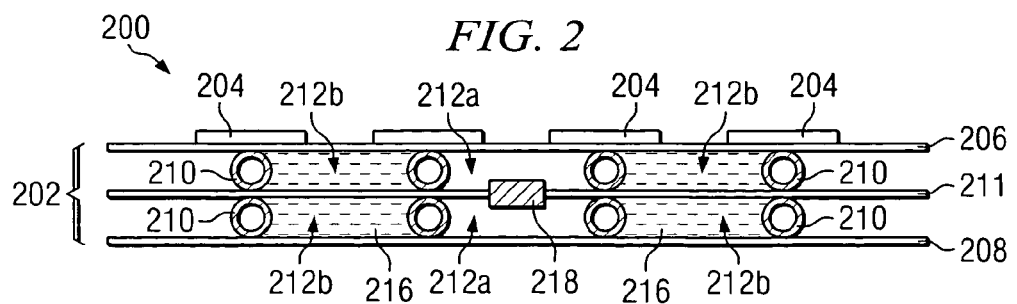
FIG. 2 is a cross-section of thin membrane antenna according to another embodiment of the present invention.

FIG. 2 is a cross-section of thin membrane antenna 200 associated with a thermal management system 202 according to another embodiment of the present invention. In this embodiment, thermal management system 202 includes two layers of spacers 210, one layer of which is disposed between a first flexible substrate 206 and a metal plating 211, the other layer of which is disposed between metal plating 211 and a second flexible substrate 208. Electronic components 204 are coupled to first flexible substrate 206 and an RF conductor 218 is coupled to metal plating 211.

RF conductor 218 is associated with heat transfer regions 212a which contain no two-phase fluid. The other heat transfer regions 212b contain a two-phase fluid 216 and functions as described above in conjunction with FIGS. 1A and 1B. Metal plating 211 serves as ground planes for RF conductor 218. In one embodiment, RF conductor 218 is a low loss stripline RF conductor; however, other suitable electronic components or conductors may be disposed within heat transfer regions 212a. In one embodiment, heat transfer regions 212a and heat transfer regions 212b are arranged in an alternating fashion along the length of antenna 200.

Figure 3:
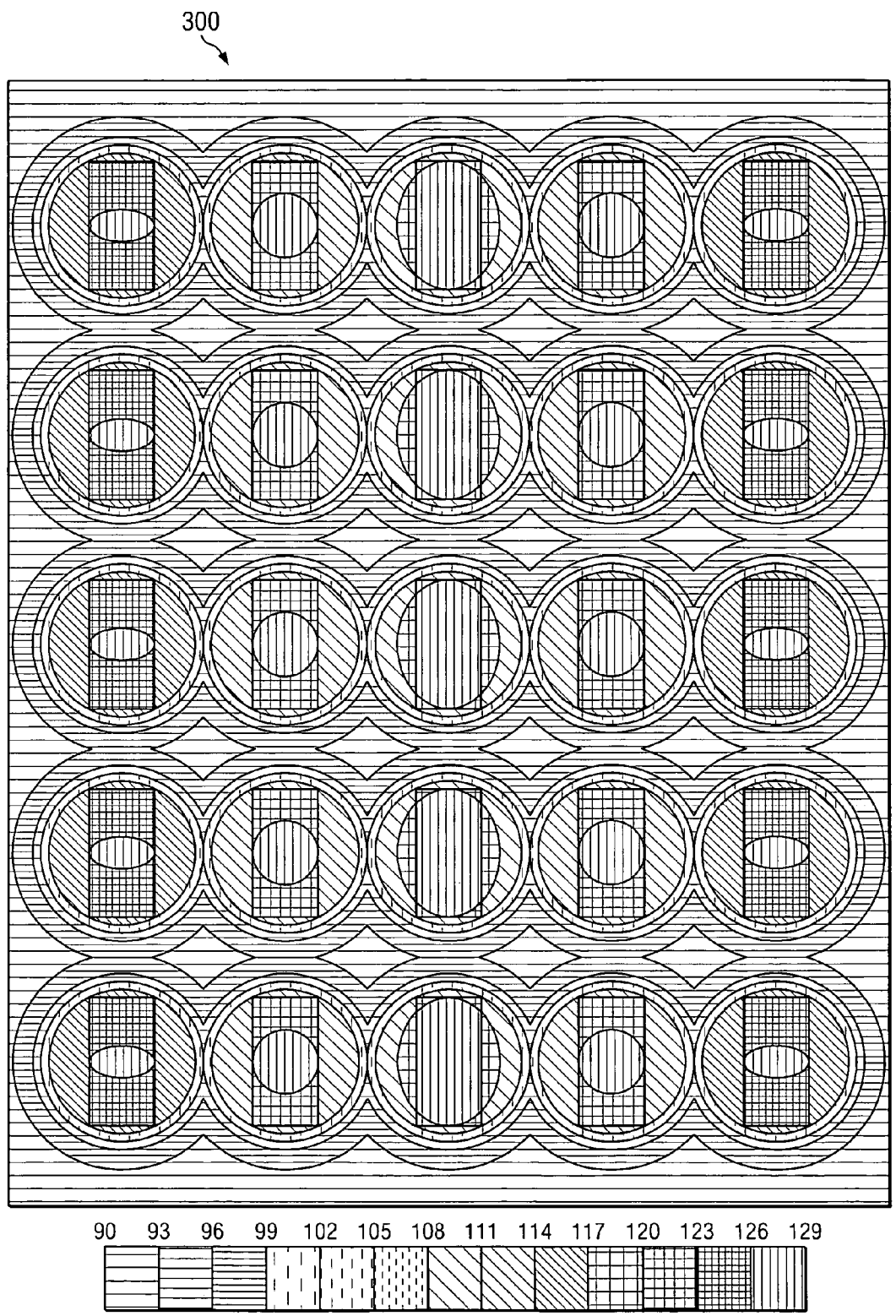
FIG. 3 is a temperature contour of a thin membrane antenna without two-phase thermal control.
Figure 4:
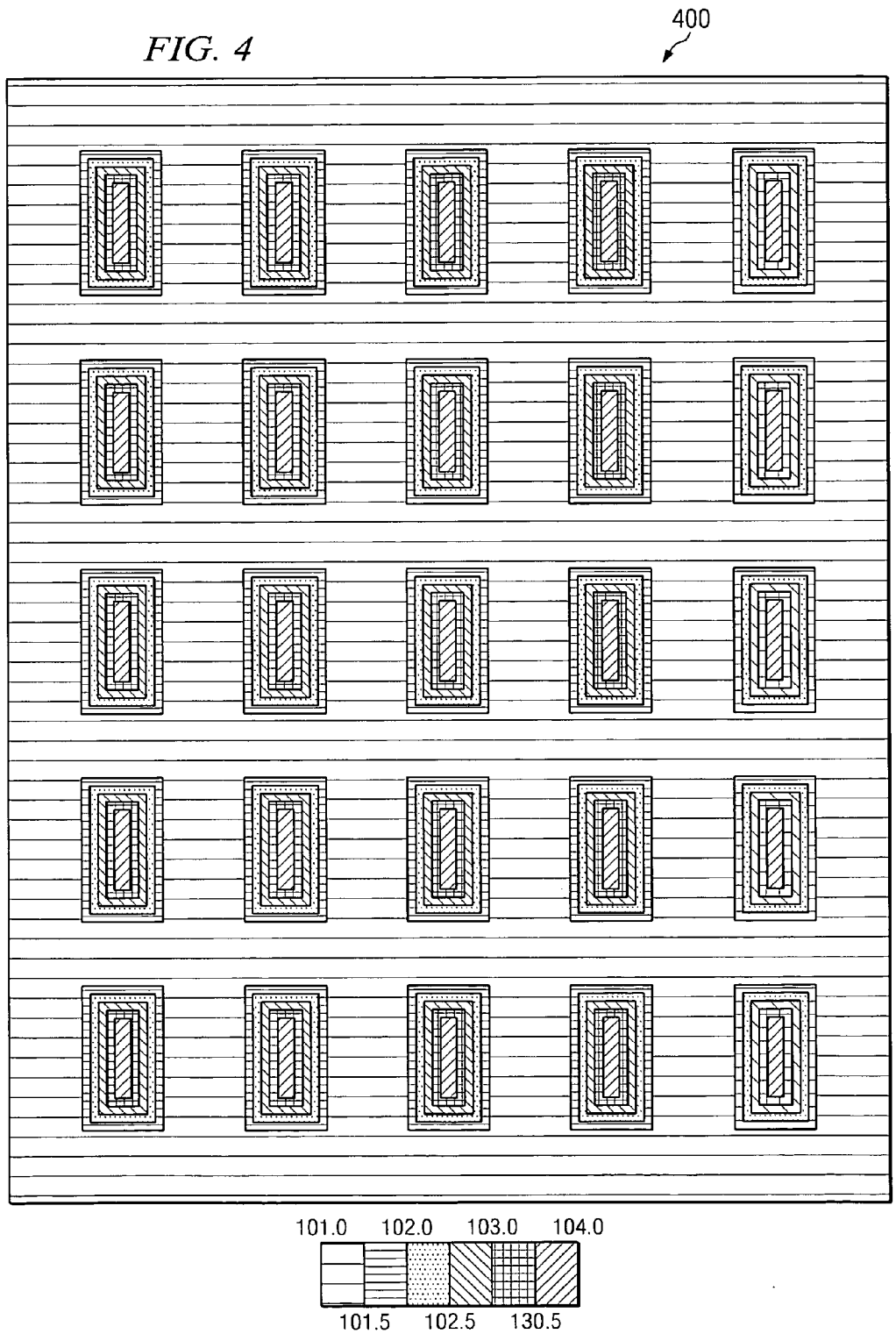
FIG. 4 is a temperature contour of a thin membrane antenna with a thermal management system according to an embodiment of the invention.

FIG. 3 is a temperature contour 300 of a thin membrane antenna without two-phase thermal control and FIG. 4 is a temperature contour 400 of a thin membrane antenna with a thermal management system according to an embodiment of the present invention. For these temperature contour, a simple thermal model of a thin membrane antenna was constructed with an array of electronic components on a 0.5 inch by 0.8 inch grid. The spreading in the membrane was equivalent to 0.4 mils of copper and the heat dissipation for each electronic component was set to 0.25 watts. The heat rejection is by radiation to deep space.

Referring to FIGS. 3 and 4, FIG. 3 shows the problem with heat spreading in the simple thermal model, in which the thin membrane antenna has thermal gradients on the order of 25° C. with a device temperature of 126° C. FIG. 4 is the same model but with a thermal management system according to teachings of one embodiment of the invention in which two-phase heat transfer is used to spread the heat and shows that the thermal gradient has been reduced to 5° C. and the peak device temperature reduced to 104° C. One reason the device temperature is decreased is because of the increased heat radiator efficiency with the lower temperature gradients.

Thus, a thermal management system according to the teachings of some embodiments of the invention could make very large, extremely low mass active array antennas a practical alternative for space-borne systems. The extremely large antennas may extend the capabilities of current systems and could enable revolutionary new sensing techniques.

Although embodiments of the invention and some of their advantages are described in detail, a person skilled in the art could make various alterations, additions, and omissions without departing from the spirit and scope of the present invention as defined by the appended claims.

What is claimed is:

1. A thermal management system for electronic components, comprising:
  a first plurality of spacers disposed between a first flexible substrate and a metal plating, each of the first plurality of spacers physically contacting both the first flexible substrate and the metal plating, the first plurality of spacers including at least one pair of adjacent first spacers comprising a first spacer and a second spacer, the first spacer and the second spacer forming a first continuous fluid housing between the first flexible substrate, the metal plating, the first spacer, and the second spacer, and wherein the first plurality of spacers forming a first plurality of capillary pumping regions proximate to the first plurality of spacers and the first flexible substrate;
  a second plurality of spacers disposed between a second flexible substrate and the metal plating, the second plurality of spacers including at least one pair of adjacent second spacers comprising a third spacer and a fourth spacer, the third spacer and the fourth spacer forming a second fluid housing between the second flexible substrate, the metal plating, the third spacer, and the fourth spacer, and wherein the second plurality of spacers forming a second plurality of capillary pumping regions proximate to the second plurality of spacers and the second flexible substrate;
  a two-phase fluid disposed within some of the first and second fluid housings;
  an RF conductor coupled to the metal plating, wherein the metal plating serves as a ground plane for the RF conductor; and a plurality of electronic components coupled to a mounting surface of the first flexible substrate, the plurality of electronic components including at least first and second electronic components positioned directly over respective spacers of the first and second spacers with a gap separating the first and second electronic components.

2. The system of claim 1, wherein the spacers are selected from the group consisting of circular tubes and solid wires.

3. The system of claim 1, wherein at least one of the first and second flexible substrates comprises a metallized polymer.

4. The system of claim 1, wherein a distance between the first and second flexible substrates is no more than 0.1 inch.

5. The system of claim 1, wherein the capillary pumping regions each comprise an acute angle of no more than 60 degrees.

6. The system of claim 1, wherein the two-phase fluid is at a pressure of no more than two psia.

7. The system of claim 1, wherein the two-phase fluid is at least 10% vapor by mass.

8. The system of claim 1, wherein the electronic components comprise a space-based antenna.

* * * * *